United States Patent [19]

Cearley-Cabbiness et al.

[11] Patent Number: 5,451,165

[45] Date of Patent: Sep. 19, 1995

[54] TEMPORARY PACKAGE FOR BARE DIE TEST AND BURN-IN

[75] Inventors: Carol L. Cearley-Cabbiness, Austin; David S. Hardcastle, Libertyhill, both of Tex.

[73] Assignee: Minnesota Mining and Manufacturing Company, St. Paul, Minn.

[21] Appl. No.: 281,300

[22] Filed: Jul. 27, 1994

[51] Int. Cl.6 .......................... H01R 9/09; H05K 1/00
[52] U.S. Cl. ...................................... 439/71; 439/331; 257/704; 257/727
[58] Field of Search ............... 439/68, 71, 73; 257/48, 257/704, 726, 727

[56] References Cited

U.S. PATENT DOCUMENTS

| | | | |
|---|---|---|---|
| 4,511,201 | 4/1985 | Baker et al. | 439/71 |
| 4,881,639 | 11/1989 | Matsuoka et al. | 206/328 |
| 4,918,513 | 4/1990 | Kurose et al. | 357/74 |
| 4,924,353 | 5/1990 | Patraw | 361/783 |
| 4,969,828 | 11/1990 | Bright et al. | 439/68 |
| 5,088,190 | 2/1992 | Malhi et al. | 29/843 |
| 5,123,850 | 6/1992 | Elder et al. | 439/68 |
| 5,127,837 | 7/1992 | Shah et al. | 439/71 |
| 5,171,290 | 12/1992 | Olla et al. | 439/71 |
| 5,302,891 | 4/1994 | Wood et al. | 324/158 |
| 5,318,451 | 6/1994 | DelPrete et al. | 439/69 |
| 5,322,446 | 6/1994 | Cearley-Cabbiness | 439/73 |

FOREIGN PATENT DOCUMENTS

0554622A2 12/1992 European Pat. Off. .
92/07045 8/1992 WIPO .

*Primary Examiner*—Donald Hajec
*Assistant Examiner*—Mark Tremblay
*Attorney, Agent, or Firm*—Gary L. Griswold; Walter N. Kirn; David W. Anderson

[57] ABSTRACT

A temporary package used to test and burn-in a bare die that will fit in a board mounted socket. The package comprises a base having contacts to engage the die and provide contact to the outer periphery, a lid for pressing the die into electrical contact and a protective cover to restrict the die from damage due to external pressures to the sides or top of the package. The die, lid and protective cover can be assembled onto the base and removed by automated equipment.

7 Claims, 13 Drawing Sheets

TEMPORARY PACKAGE FOR BARE DIE TEST AND BURN-IN

BACKGROUND OF THE INVENTION

1. Field of the invention

This invention relates to a package for testing unpackaged or bare die and in one aspect relates to a carrier for positioning the bare die to make electrical contact therewith and to the outside of the package to permit electrical testing and burn-in.

1. Background of the Invention

Semi-conductor devices are subjected to test and burn-in and it is conventional that the semi-conductor or integrated circuit be packaged before these tests. This has become economically undesirable for semi-conductor manufactures and it is therefore more desirable to test the bare die before packaging. This bare die testing is exemplified in European Patent Application 0 554 622. This publication teaches the use of microbumps, preferably copper spheres soldered to the pads and distributed in a pattern corresponding to the pattern of contact pads of the bare die under test.

U.S. Pat. No. 5,302,891 discloses a two piece reusable burn-in/test fixture for discrete dies and comprises an assembly with one member affording electrical connection to the die and to the test fixture and a second portion for pressing the die against the electrical contacts and holding the same in contact.

U.S. Pat. No. 4,918,513 also discloses a packaging method for mounting an integrated circuit chip on an electronic circuit board and includes a small sized substrate having an electrode pattern disposed on its surface. An IC chip is mounted on the substrate and is connected with the electrode pattern. A mold layer is provided to cover the IC chip and connector pins project from the substrate permitting the carrier to be mounted in a socket on the surface of an electronic circuit board to test the IC device.

The known temporary die carriers are not particularly designed to be compatible with automation equipment. These devices require manual application of force such as hinged components, clamps, screws, etc.

Further, existing methods of establishing temporary electrical connection to the die under tests incorporate wire bonds from the die pad to the temporary package, the use of a temporary connection established by a polyamide film or substrate with metal traces for electrical contact with resilient contacts.

It is better that optical placement of the die on the die interconnect assures correct alignment between the bond pads of the die and the interconnecting electrical contacts and eliminating costly precision wafer dicing required by other mechanical alignment means, such as hard stops and spring force plates.

The method of the present invention utilizes a precise penetration of the die pads by pillars on the wafer which penetrate the aluminum oxide on the die pads and optical placement of the die insures correct alignment. Further, this system does not leave a marred surface on the die which requires additional work prior to the packaging.

The present invention overcomes the disadvantages of existing products by providing a temporary package for bare die which can be loaded and unloaded by precision handling automation equipment.

SUMMARY OF THE INVENTION

The present invention relates to a temporary package for use with bare die to permit the test and burn-in of discrete die. The temporary package is particularly designed for use with automation equipment for loading and unloading a die in the temporary package. The temporary package comprises a base of generally rectangular configuration with a top and bottom surface and four sides. The base has a recess in at least one of the sides and means defining a receptacle on the top surface to receive a contact insert. A plurality of contact strips having a generally elongate shape are adapted to fit in the recesses. The strips are formed for temporary mounting in the recesses and each contact strip comprises the plurality of contacts, which are formed at one end to contact with the insert and having a second end positioned to make contact with an external component. A lid is formed to cover the receptacle on the base and the contact insert. The lid comprises a pressure plate to contact a bare die and bias means for forcing the pressure plate towards the receptacle. A cover for the pressure plate and bias means also includes means for securing the lid to the base for positioning the pressure plate over the receptacle to force a die into electrical contact with the contacts on the contact strip. The lid is secured to the base by pawl means on the cover for temporarily engaging detentes on the base and the pawl means extend in a direction to receive a biasing force for releasing the pawl means from the detentes.

The temporary package of the present invention may further comprise a protective cover which is positioned to surround the lid. The protective cover is formed with pawls positioned adjacent to the pawls on the lid cover to secure the protective cover to the base. The protective cover is provided with bias means which bias the protective cover to a position free of the lid.

DESCRIPTION OF THE DRAWING

The present invention will be further described with reference to the accompanying drawing wherein.

DETAILED DESCRIPTION OF THE PRESENT INVENTION

Figure 1:
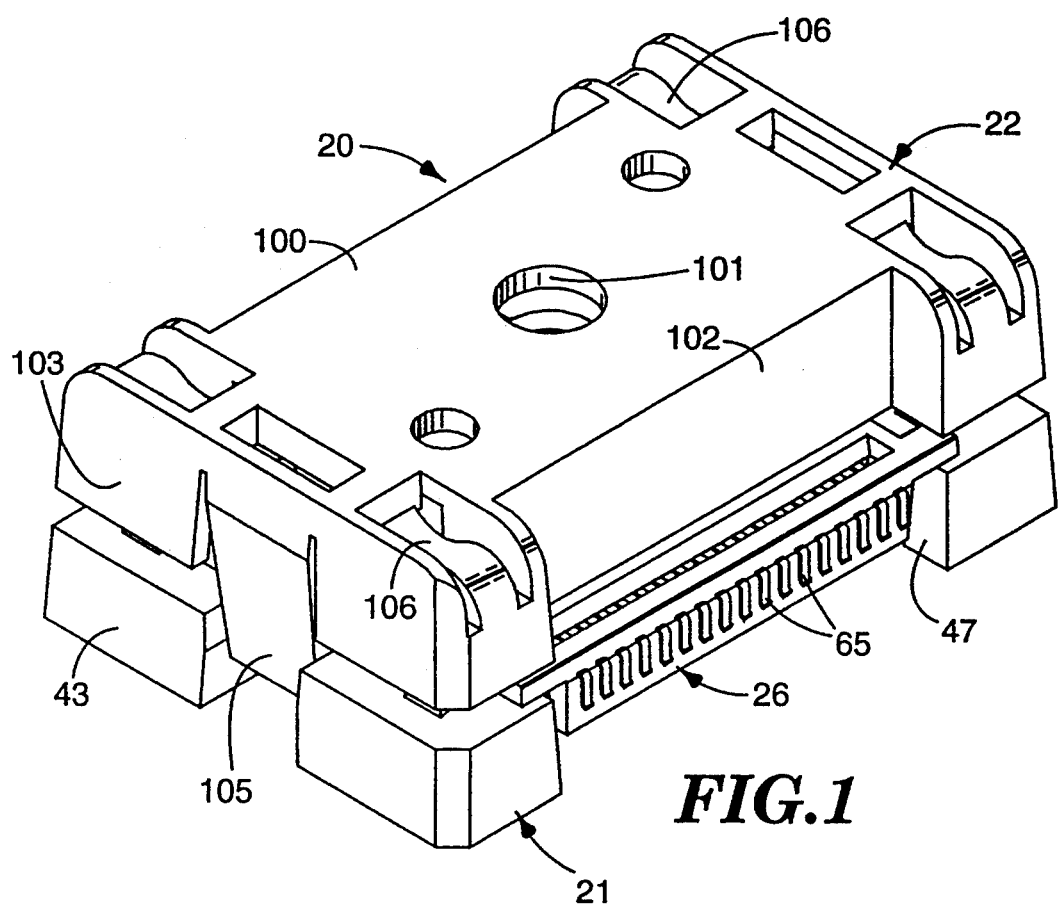
FIG. 1 is an isometric view of a temporary package according to the invention in assembled condition.

Referring now to the drawing, particularly to the embodiment of FIGS. 1-9, the temporary package 20 provides a method of testing and burn-in of bare die. The temporary package 20 is designed to be handled by automation equipment for loading and unloading a bare die from the package. Further the package is designed to be placed in a socket of a standard configuration such that the die supported therein may undergo the test and burn-in. To accomplish this the die package has to be designed for assembly and disassembly by the automation equipment and it must necessarily be of a size and configuration for use in existing sockets for test and burn-in of integrated circuit (IC) devices.

The temporary package comprises a base 21 and a protective cover 22. An insert 24 is adapted to make electrical interconnection with a die 25 and contact means for interconnecting the insert 24 with an electrical component outside of the package. This means for interconnection between the insert and the outside of the package comprises contact strips 26. A lid 30 provides means for maintaining the die in pressure electrical contact with the insert 24. This lid 30 comprises a pressure plate 31, a plate holder 32, a spring 34 and a latching cover 35.

Figure 2:
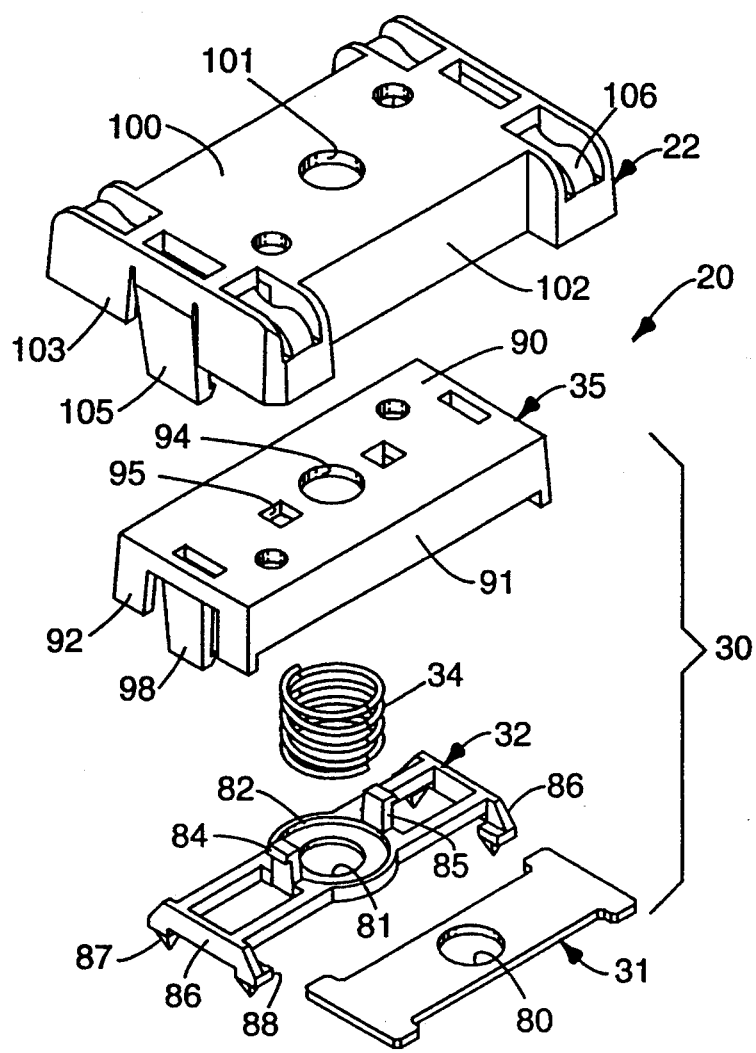
FIG. 2 is an exploded view of the temporary package of FIG. 1 showing the parts separated from each other and showing a bare die.
Figure 2:
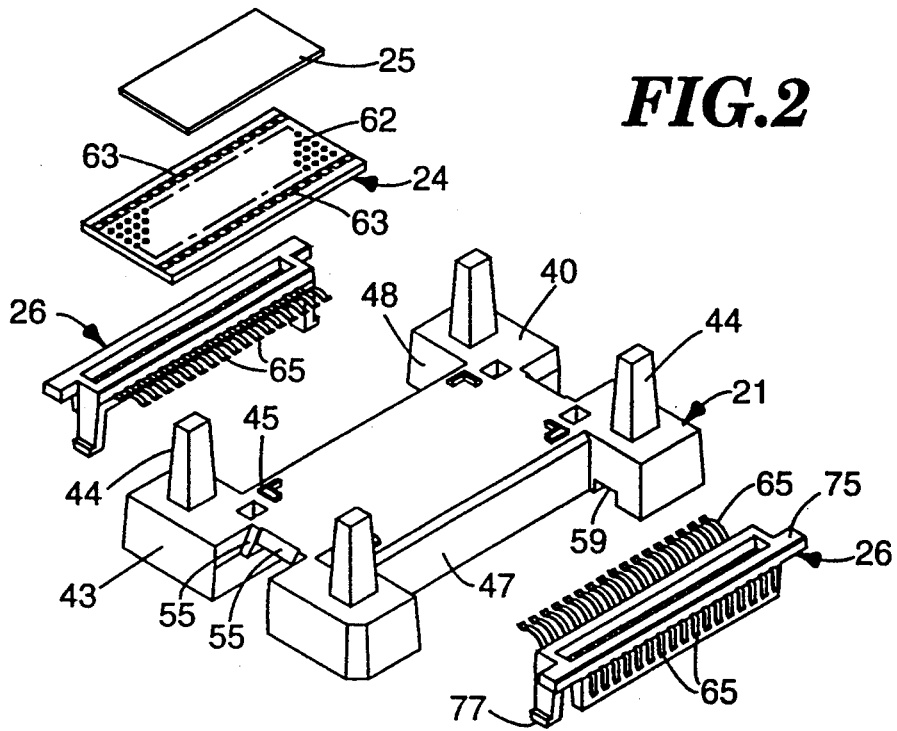
Figure 3:
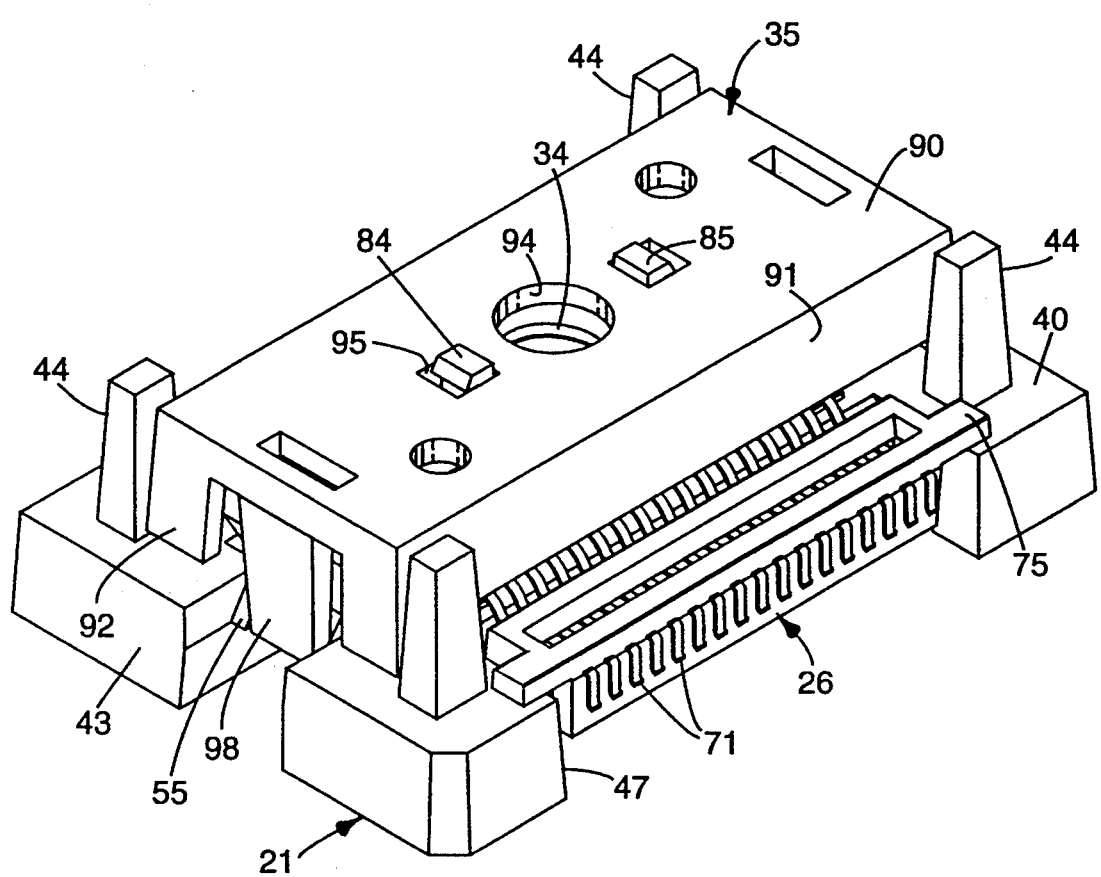
FIG. 3 is an isometric view of the temporary package according to the present invention with the protective cover removed.
Figure 6:
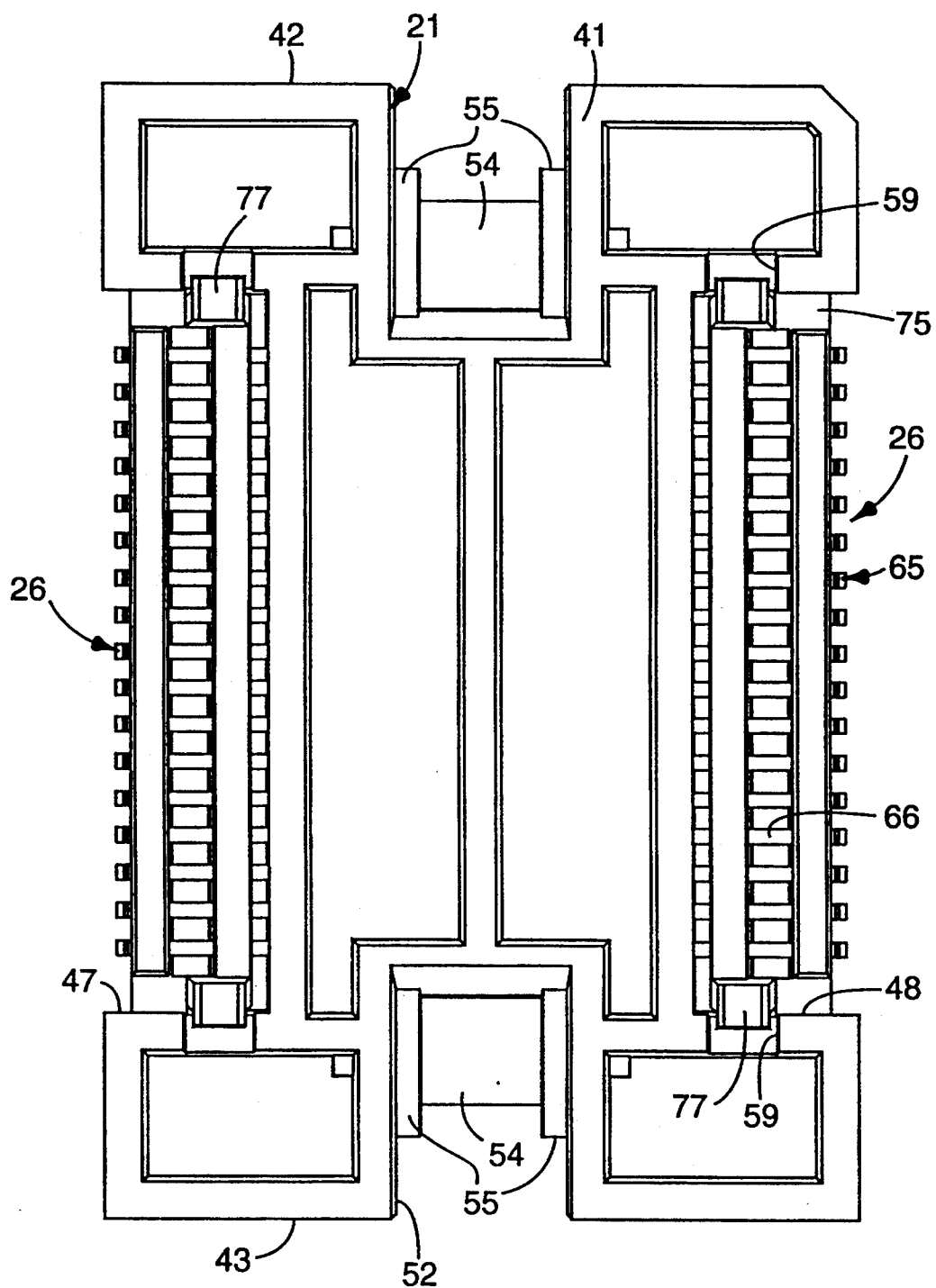
FIG. 6 is a bottom view of the base of the temporary package shown in FIGS. 1 thru 4.
Figure 7:
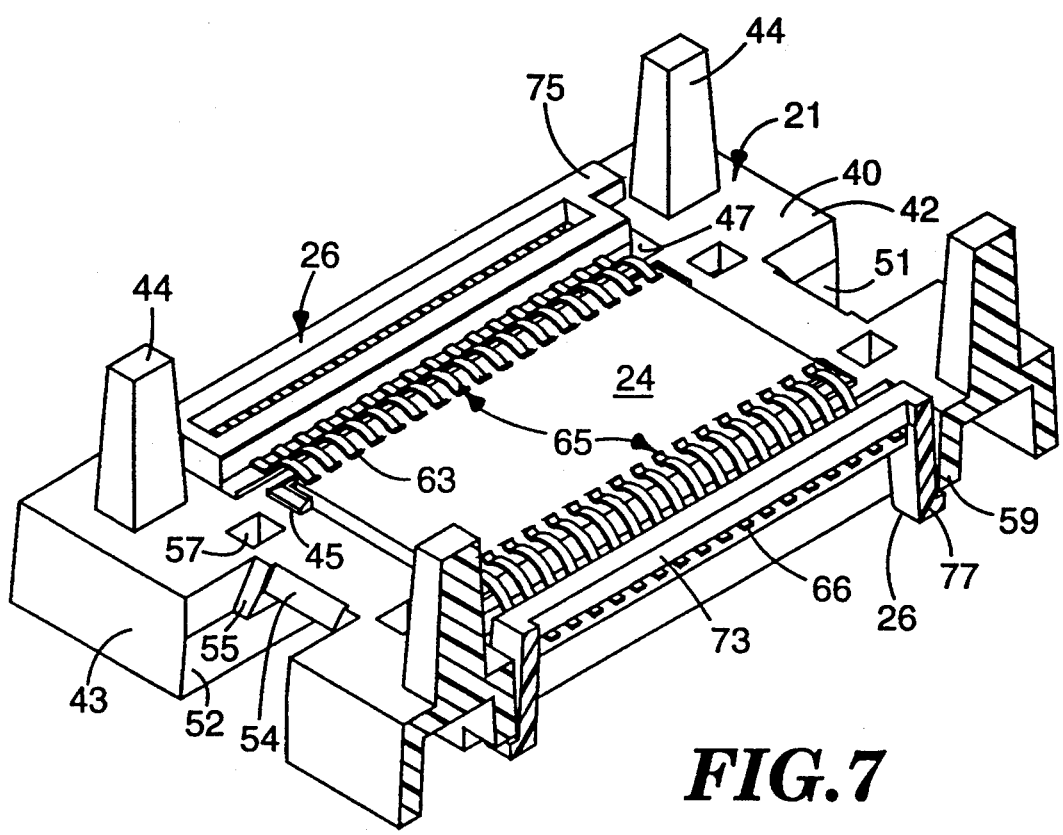
FIG. 7 is an isometric view of a base of a temporary package viewing the same from one angle.

The base 21 is best described with reference to FIGS. 2, 6 and 7, which illustrate the base as having a generally rectangular configuration, and in this embodiment an upper surface 40 and a lower or opposite surface 41. The base is molded of a material having a surface resistivity of $10^9$ ohms/sq or greater, a dissipative composition or insulative material and comprises opposite ends 42 and 43. A support means extends from the upper surface 40 adjacent the ends or the base or corners to afford protection of the lid. As illustrated the support means comprises four generally symmetrical pillars 44. The base 21 is also provided with registration means defining a recess on the upper surface 40 of the base 21. The registration means can be formed by a recess in the surface, it can be defined by stops at opposite ends and at opposite sides of the area to receive the insert, or as illustrated this recess can be defined by corner tabs 45 which are angle shaped and molded on to the upper surface 40 defining locating corners with inside oppositely facing surfaces defining the registration means or recess. The base 21 is further formed with recesses 47 and 48 in the opposite side edges of the base 21 for receiving the contact strips 26. The ends 42 and 43 are also provided with recesses 51 and 52 which are also formed with detentes 54 and 55, each having a downwardly and outwardly directed slope terminating in an edge. A plurality of locating apertures 57 are also formed in the upper surface 40 of the base 21. As seen in FIG. 2 and FIG. 6 the base 21 is also formed with recessed areas in the bottom surface 41 for receiving tabs on the contact strips 26. These recessed areas are generally designated 59 as shown in FIGS. 2 and 6. To reduce the amount of material to form the base 21, recesses are formed in the bottom surface 41, which also reduce the weight and the possibility of warpage of the molded base.

A preformed contact insert 24 is adapted to be placed on the base 21 and located within the recess formed by the corner members 45. The insert 24 may be formed with a pattern of contact surfaces 62 on its exposed surface for making electrical contact with a pads on a bare die 25. These contact areas 62 are joined to peripheral contact pads 63 on the insert.

Figure 4:
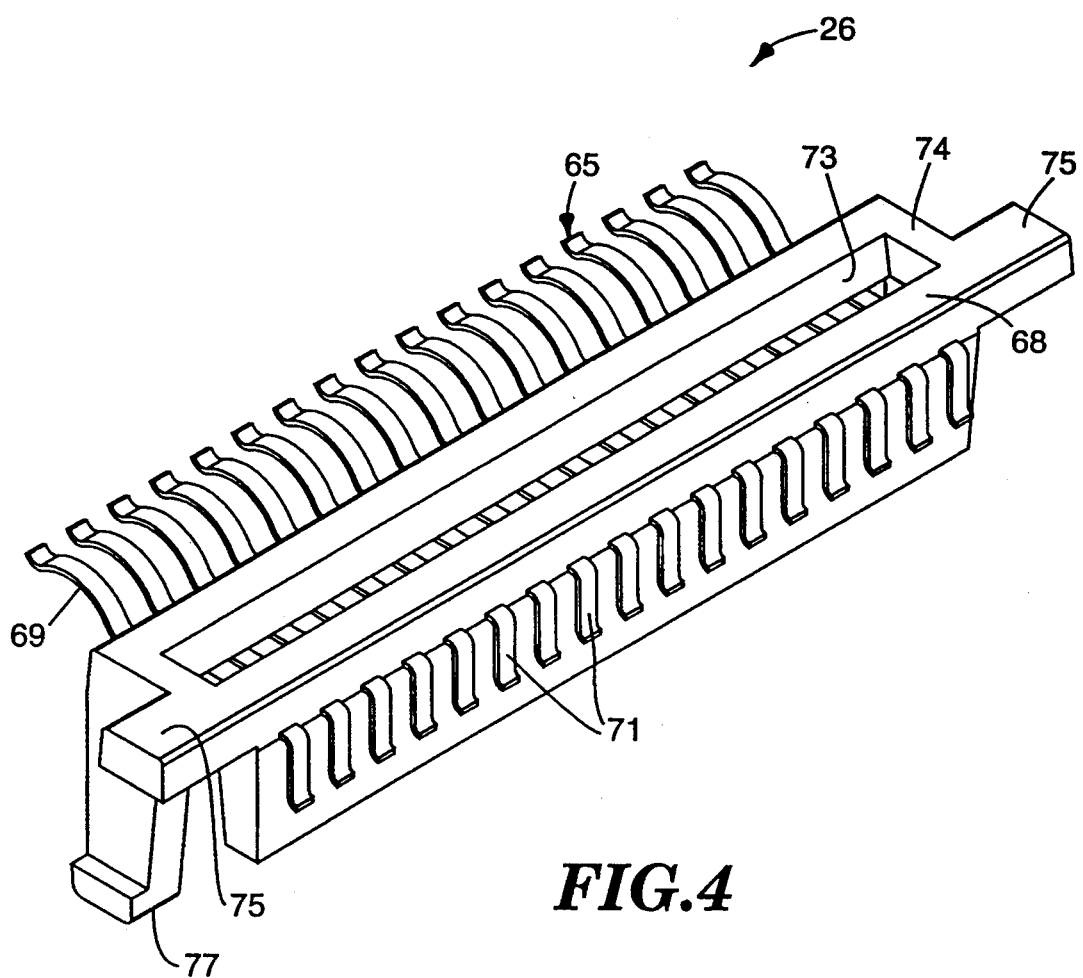
FIG. 4 is an isometric view of a contact strip used in the temporary package of FIG. 1.
Figure 5:
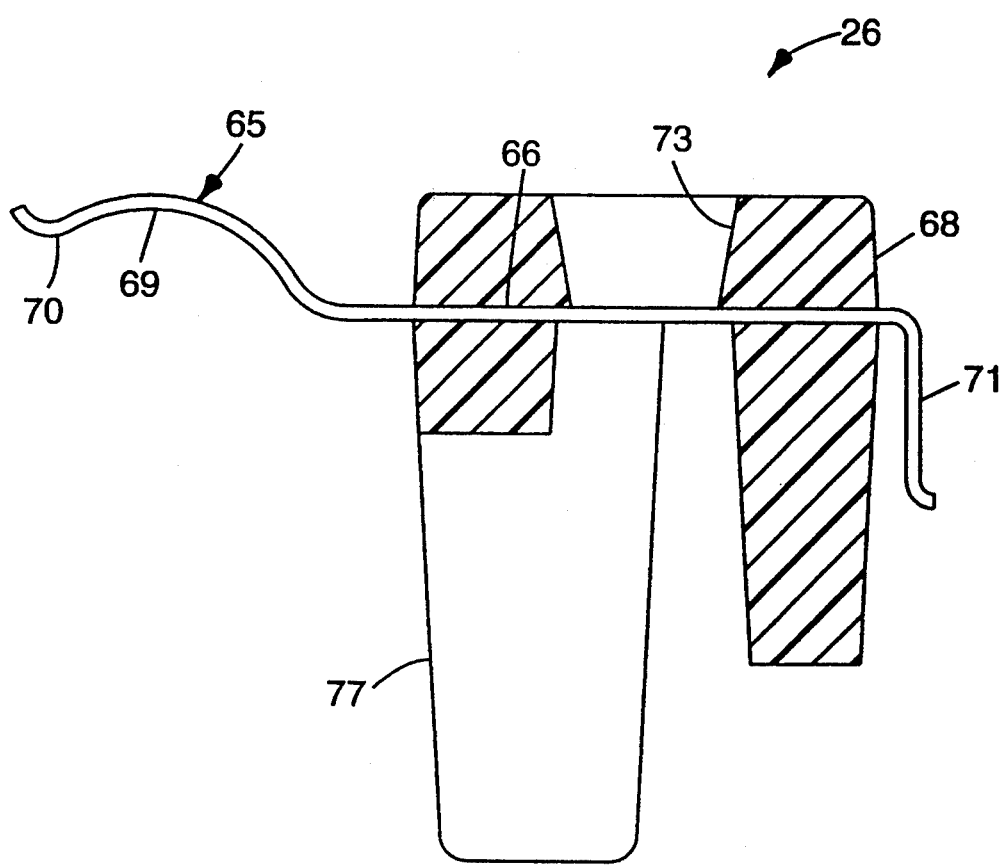
FIG. 5 is a cross sectional view of the contact strip of FIG. 4.

The contact strips 26 are adapted to fit within the recesses 47 and 48 at the peripheral edges of the base 21. The contact strips 26 can make contact with a bare die or as illustrated make contact with the bare die 25 through an insert 24. Each of these strips are identical and each comprises a plurality of contacts 65 formed of a conductive metallic material as illustrated in FIGS. 4 and 5 and have a generally planar portion 66 disposed in parallel aligned spaced relationship with each other and molded into such spaced parallel relationship by insularire material defining the elongate support 68 forming the contact strip. Each contact 65 is further provided with an arcuate portion 69 terminating in a contact surface 70 adapted to make electrical contact with the die 25 or, as illustrated, through resilient pressure electrical contact with a pad 63 on the insert 24. The opposite end of the contact 65 is formed with a bent end portion 71 defining an electrical contact on the periphery of the package 20, and the end portion 71 is adapted for electrical connections to an external electrical component. This external electrical component would be a contact in a socket for testing an IC device, which socket may be mounted on a printed circuit board forming part of a test and burn-in fixture.

The molded insulative strip 68, formed by overmolding the plurality of contacts 65, is formed in its upper surface with a recess 73 exposing a surface of each of the contacts 65 along their planar portion 66 to permit contact with the contacts 65 at this location.

The contact strip 26 terminates at its opposite ends in symmetrical fashion having adjacent its upper or top surface 74, projections 75, which projections 75 rest on the surface 40 of the base 21. Depending from the upper surface 74 of the contact strips 26 at each end are pawls 77, see FIG. 4, which engaged the recesses 59 formed in the lower surface 41 of the base 21. Between the projections 75 and the pawls 77 the contact strips 26 are retained in position with the contact portion 70 of each contact 65 making electrical contact with a pad 63 on the edges of insert 24.

Each die 25 is formed with a specific array of contact pads which can be optically positioned with respect to the contacts 62 on the preformed insert 24 to locate a die 25 such that the pads 63 are each in contact via contacts 62 with a lead of the die.

Figure 8:
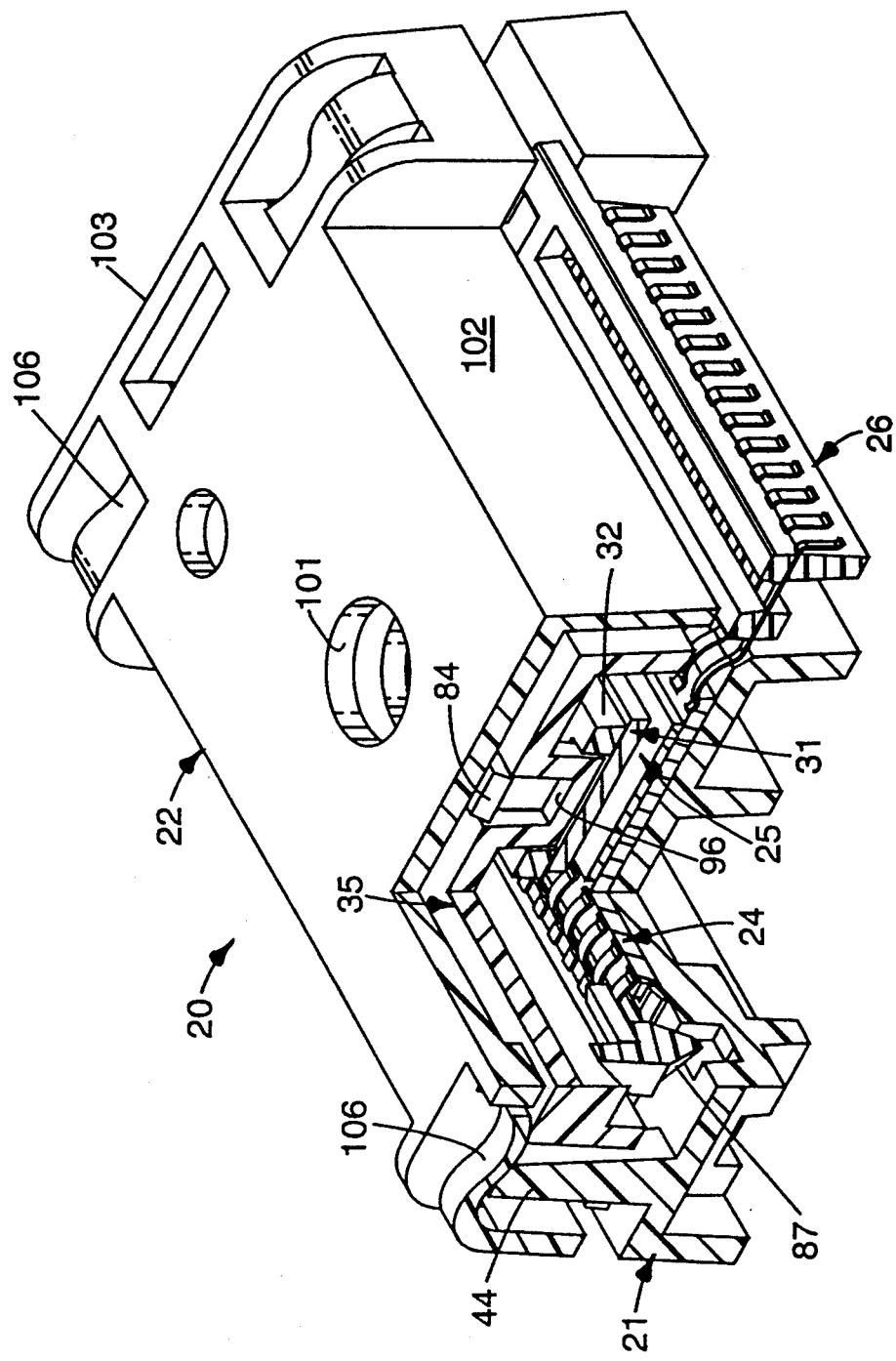
FIG. 8 is an isometric view of the temporary package of FIG. 1 partially in section to show the inner relationship of the respective portions thereof.
Figure 9:
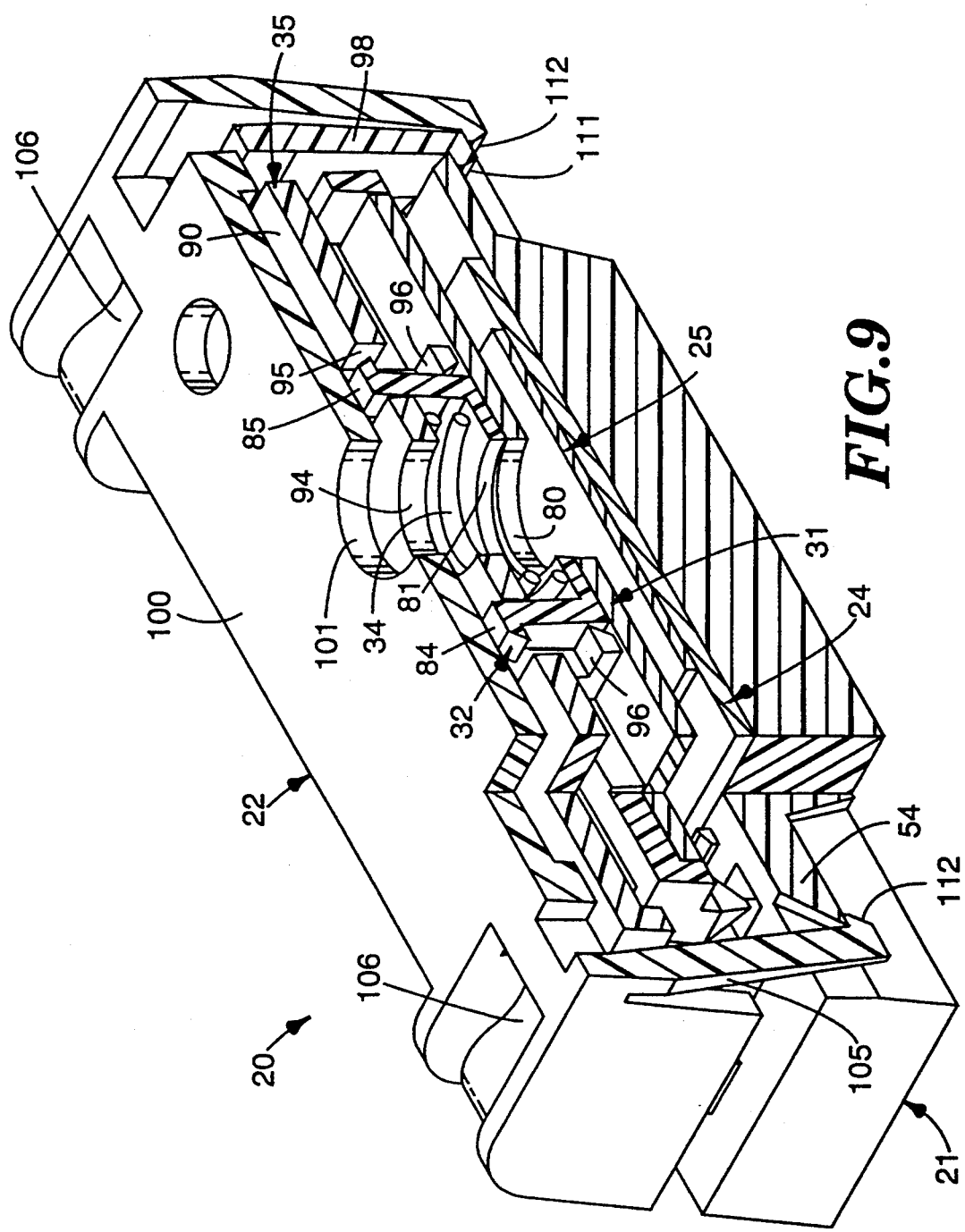
FIG. 9 is a longitudinal sectional view of the temporary package of FIG. 1 in isometric view.

The lid 30 forms a force applying assembly which is supported from the base for temporarily retaining the die 25 in releasable electrical contact with the contacts on the base 21. The lid 30 comprises a pressure plate 31 having a central probe opening 80 and movably supported in a cover 35. Pressure plate 31 is made of a substantially rigid material such as stainless steel. The pressure plate 31 is supported in a plate holder 32 which is molded of insulative material comprising a central probe opening 81 in a recessed centrally located section 82 positioned between two upstanding clip members 84 and 85 which terminate in hooked end surfaces extending in opposite directions. Extending beyond the recessed central portion 82 are spaced parallel arms which terminate in a cross bar 86 at each end of the holder 32 from which depend guide members 87 which are received in the registration openings 57 of the base 21 for locating the plate holder 32. Below and outward of the arms, and extending inwardly from the cross bars 86, are shoulders or ledges 88 which receive the corners of the pressure plate 31 to frictionally retain the same in registration on the holder 32. The helical compression spring 34 is adapted to fit within the recessed area 82 and serves to force the holder 32 and pressure plate 31 in a direction away from the cover 35. The cover 35 is a generally rectangular shell having a top surface 90, downwardly extending sidewalls 91 and endwalls 92. The surface 90 has a central aperture 94 of circular configuration to receive the probe which also passes through the spring 34 and the openings 80 and 81. Additionally, there are openings 95 for receiving the clips 85 and permitting the formation of recessed surfaces 96 forming detentes for restricting the movement of the clips 85. The surfaces 96 are shown in FIGS. 8 and 9. The clips 85 have hooked end portions which secure the holder 32 to the cover 35 such that the movement of the holder 32 from the cover 35 under the bias of the spring 34 is restricted by the length of the clips 84 and 85 and spacing of surfaces 96 from the bottom of the cover 32. Formed adjacent the endwalls 92 are depending hooks 98 which terminate in an inwardly turned hook member which is formed to engage the detent 54 on the base member 21. These hooks 98 support the lid on the base and restrict movement of the cover 35 away from the base 21 under the bias of spring 34. Spring 34 thus applies pressure through the holder 32 to the pressure plate 31 forcing the die 25 against the insert 24.

The temporary package, comprising the base 21, insert 24, contact strips 26 and lid 30 is operative to permit the test/burn-in for bare die such as 25. The pillars 44, or variations thereof form an upstanding fixed structure to protect the force applying mechanism from side or vertical pressure. In handling the temporary package however, there is a risk that harm could come to the die by an impact against the cover 35. It is therefore preferred that a protective cover 22 be applied to the package. The protective cover 22 provides means supported from the base to isolate the lid and related force applying mechanism from side or top, vertical pressure, ensuring a stable interconnect between the die 25 and the interconnect provided by the insert and base. The protective cover 22 comprises a generally rectangular cover member having a top surface 100 with a central probe receiving opening 101 and downwardly depending sidewalls 102 and endwalls 103. At the central portion of endwalls 103 are depending pawls 105 terminating in a hook member extending inwardly from the endwall 103. The hooks 105 are sufficiently resilient such that when the protective cover 22 is placed over the lid 30 down onto the base 21 the pawls 105 are cammed outwardly by the inclined surfaces of the detentes 55 at the ends of the base 21 such that the pawls 105 are separated and dropped below the detentes 55 to lock the protective cover 22 onto the base 21 in a fashion to surround the cover 35 of the lid 30. The hooks on the free ends of the pawls 105 fit beneath the pawls 98 as shown in FIG. 9. Molded at the corners of the protective cover 22 are spring members 106 which bias against the tops of the pillars 44 and urge the protective cover 22 away from the base 21 assuring that the pawls 105 remain in engagement with the undersurface of the detentes 55 protecting the lid 30 and the die from harm caused by impact to the temporary package.

The hooks 98 on the ends of the cover 35 and the pawls 105 are provided with beveled edges beneath the shoulder forming the hook on both members such that automated assembly equipment may engage the temporary package from the lower surface as shown in FIG. 9 and engage these beveled surfaces on these members 98 and 105 respectively, see FIG. 9, to urge the same out of engagement with the detentes 54 and 55 respectively. Disengagement of the hook and pawl from these detentes separates the lid 30 and protective cover 22 from the base 21 permitting the die 25 to be relocated and removed from the temporary package. Further, with the automated equipment the die 25 can be optically aligned on the insert 24 as above mentioned and the lid 30 and die are assembled automatically onto the base with the hooks 98 being forced outwardly by the detentes 54 on the base until the same engage with the hook members 98. Generally the protective cover 22 is placed onto the base contemporaneously with the lid 30 or it can be placed on the base subsequently.

Referring now to the embodiment of FIGS. 10, 11, 12 and 13, the temporary package 120 illustrated in these views comprises a base member 121, a protective cover 122, an insert 124, adapted to make electrical interconnection with a die 125 and contact means for interconnecting the insert 124 with an electrical component outside of the package. This means for interconnection between the insert 124 and the outside of the package 120 comprises contact strips 126. A lid 130 provides means for maintaining the die 125 in pressure electrical contact with the insert 124. This lid 130 comprises a pressure plate 131, a plate holder 132, a spring 134 and a latching cover 135.

Figure 10:
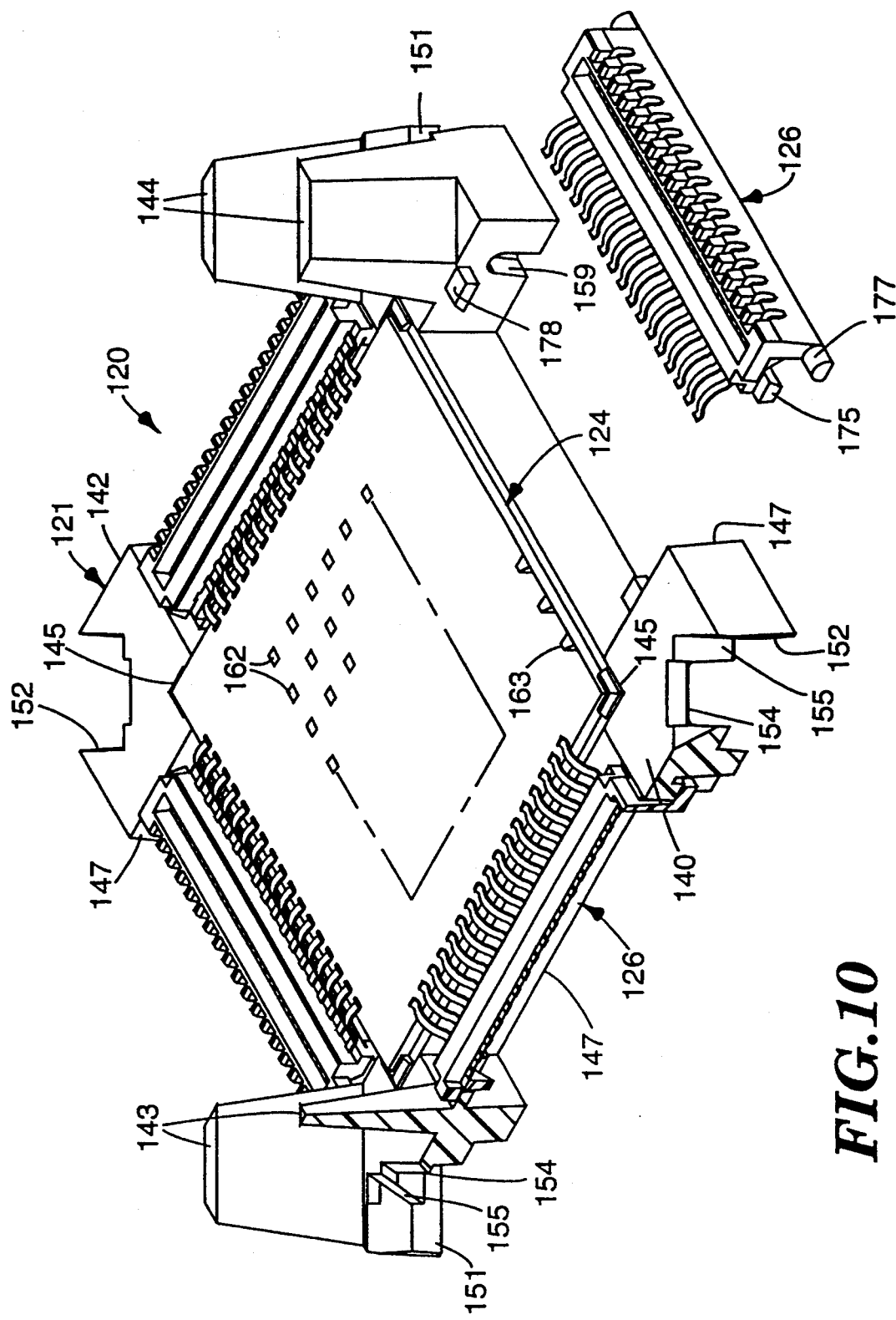
FIG. 10 is an isometric view partially in section and partially in exploded diagrammatic view to show a second embodiment of a temporary package according to the present invention.
Figure 11:
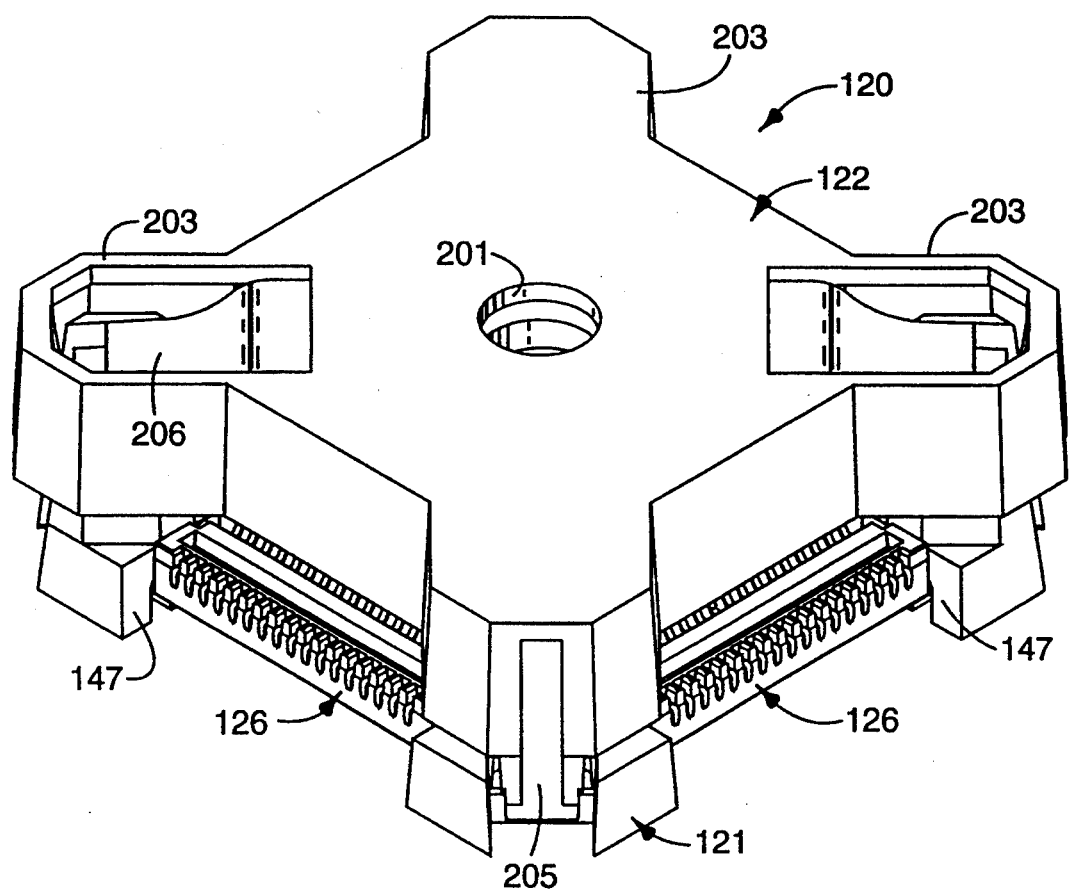
FIG. 11 is an isometric view of the second embodiment of the temporary package in assembled relationship.

The base 121 is illustrated in FIG. 10 which illustrates the same as having a generally rectangular configuration, and in this embodiment an upper surface 140 and a lower surface 141. The base 121 is molded of an insulative material and comprises four sides 142. From the upper surface 140, at diagonally opposite corners extend a pair of pillars 143 and 144 and registration means defining a recess on the upper surface 140 of the base 121. As illustrated this recess is defined by corner tabs 145 which are angle shaped and molded onto the upper surface 140 defining locating corners with inside surfaces defining the recess. The base 121 is further formed with recesses 147 at each of the side edges for receiving contact strips 126. The corners are each provided with opposite pairs of recesses 151 and 152, which are formed to extend diagonally and are located at diagonally opposite corners, and the recesses are formed to provide detentes 154 and 155, each having a downwardly and outwardly directed slope terminating in an edge. As illustrated in FIG. 10 the base 21 is formed with recessed areas 159 in the bottom surface 141 for receiving locking tabs 177 on the contact strips 126, which contact strips are generally the same as the contact strips 26, except the position of the tabs 177 is toward the outside of the strips 126 and the support projections 175 are located inward and are positioned below the upper surface of the contact strips to rest on location bars 178.

A preformed contact insert 124 is adapted to be placed on the base 121 within the recess formed by corner members 145 and located on the upper surface 140 of the base. The insert 124 may be formed with a pattern of contact surfaces 162 on its exposed surface for making electrical contact with leads or pads on a die 125. These contact surfaces 162 are joined to peripheral contact pads 163.

The contact strips 126 are adapted to fit within the recesses 147 at the peripheral edges or sides of the base 121. Each of these strips are identical and comprise a plurality of contacts 165 formed of a conductive metallic material, and each with the generally planar portion, an arcuate portion terminating in a contact surface adapted to make resilient pressure electrical contact with the pads 163 on the insert 124, and a bent end portion defining an electrical contact on the periphery on the package 120. The contacts are the same as the contacts of strips 26. The contacts 165 are molded into the strips by an insulative material.

Each die 125 is formed with a specific array of contact pads which can be optically positioned with respect to the contacts 162 on the preformed insert 124 to locate the die 125 such that the contacts are in contact with the leads or contact pads of the die.

Figure 12:
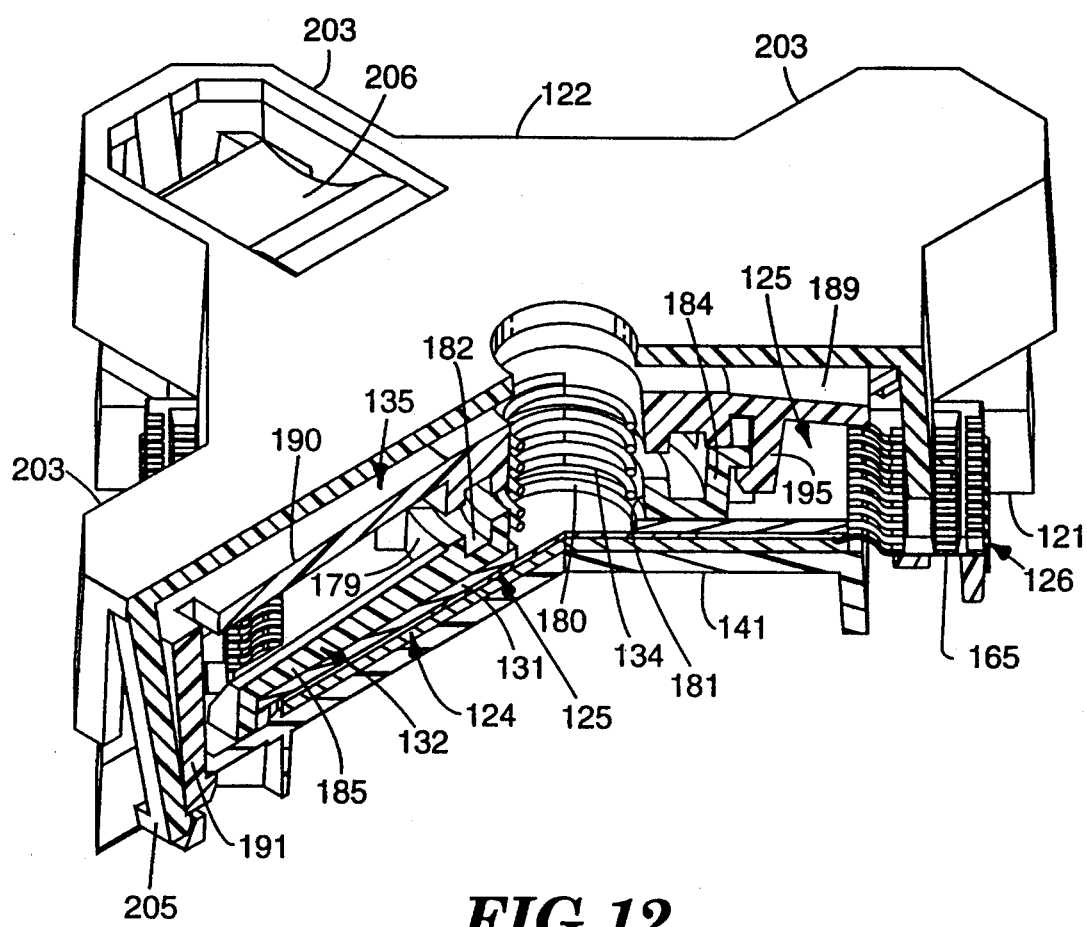
FIG. 12 is a sectional view of the package shown in FIG. 11 in isometric relationship.
Figure 13:
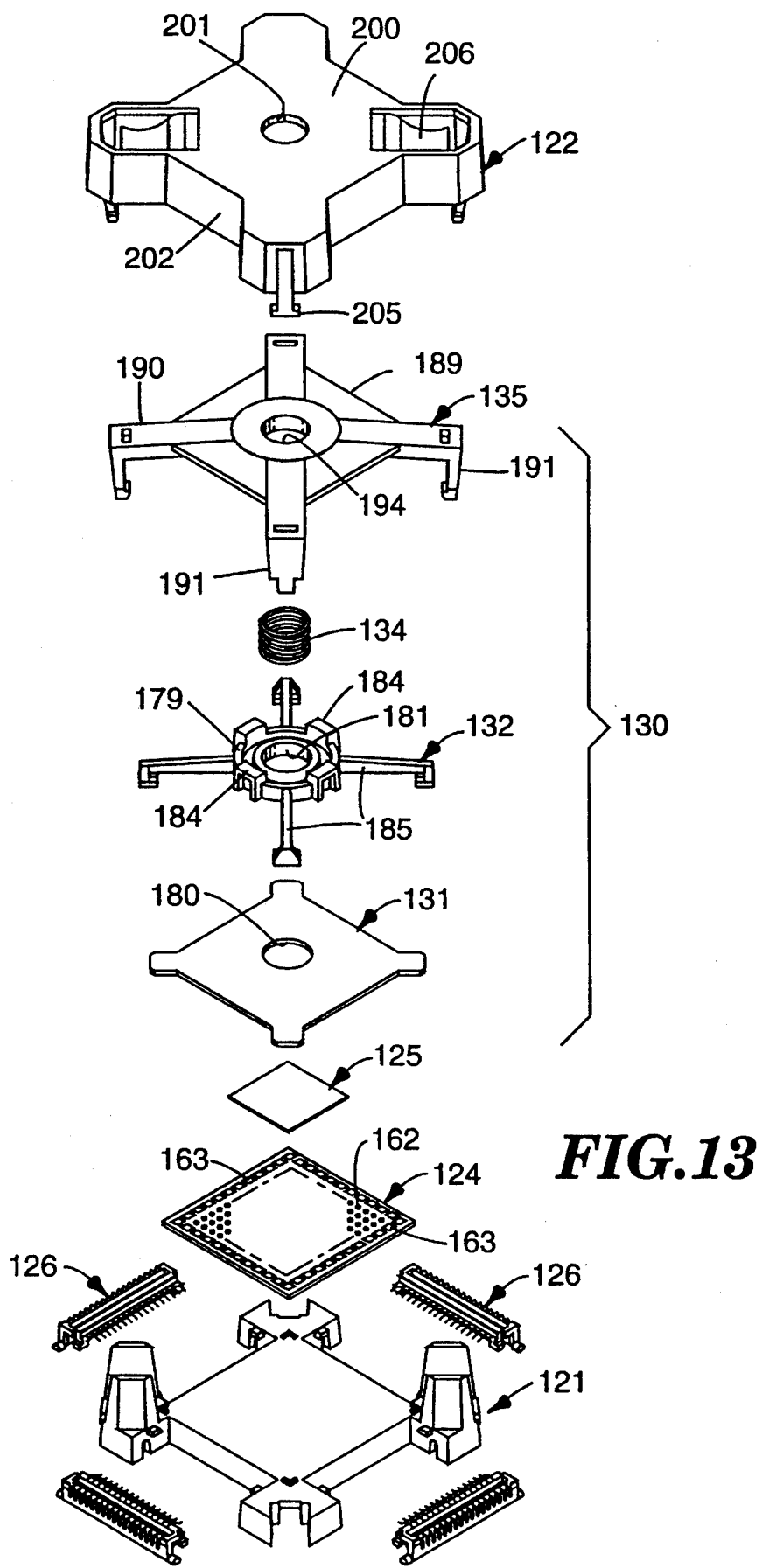
FIG. 13 is an exploded view of the temporary package shown in FIGS. 10 thru 12.

A lid 130, forming an assembly for temporarily retaining the die 125 in releasable electrical contact with the insert 124, comprises a pressure plate 131 having a central probe opening 180. Pressure plate 131 is made of a substantially rigid material such as stainless steel. The pressure plate 131 is supported in a plate holder 132 which is molded of insulative material comprising a hub portion 179 with a central probe opening 181 in a recessed centrally located section 182 of the hub portion 179. Positioned about the central section 182 are upstanding clip members 184. Radiating outward from the hub portion 179 are arms 185 which terminate in hooked surfaces extending downwardly from the ends and turned inward toward the hub portion 179. The hooked surfaces form retainers for the pressure plate 131 and frictionally retain the pressure plate 131 onto the plate holder. A helical compression spring 134 is adapted to fit within the recessed area surrounding the opening 181 in the hub portion 179 and serves to force the pressure plate 131 in a direction away from a cover 135 placed over the plate holder and pressure plate forming the pressure applying mechanism of the package 120. The cover 135 is a generally rectangular shell having a top plate 189 and radially extending legs 190 which terminate in down-turned feet 191 forming resilient pawls to be captured beneath the detentes 155. The cover 135 has a central aperture 194 of circular configuration to receive the probe which also passes through the spring 134 and the openings 180 and 181. Additionally, there are resilient hooks 195 depending from the plate 189 which are received under the shoulder provided on the radially outer portions of clip members 184. The clips 184 and the hooks 195 limit the separation of the pressure plate from the cover 135 by the length of the feet 191 and the slots of the clips 184. The hooks 195 and the shoulders of the clips 184 are best seen in FIG. 12. Two of the legs 190 are respectively received between the pillars 143 and 144 at opposite corners of the base 121 and form guide members which help locate as well as secure the cover and force applying means to the base 21. Thus the force applying mechanism is described and can serve to maintain the bare die 125 in electrical engagement with the contacts 162 on the insert 124. As shown in FIG. 12 the lower portion of the feet 191 is truncated to form a cam to afford removal of the feet 191 from engagement with the bottom surface of the base 121, affording the removal of the die 125.

The temporary package 120, comprising the base 121, insert 124, contact strips 126 and lid 130 is operative to permit the test/burn-in for bare die such as 125. In handling the temporary package however, there is the risk that harm could come to the die by an external force and it is therefore preferred that a protective cover 122 be applied to the package. The protective cover 122 provides means supported from the base to isolate the lid and related force applying mechanism from side or vertical pressure, ensuring a stable interconnect between the die 125 and the interconnect provided by the insert and base. The protective cover 122 of the embodiment of FIGS. 10-13 comprises a generally rectangular cover member 122 having a top surface 200 with a central probe receiving opening 201 and downwardly depending sidewalls 202 joined by projecting corner members 203. At the corner members are depending pawls 205 terminating in a hook member extending inwardly from the corners 203. The hooks 205 are sufficiently resilient such that when the protective cover 122 is placed over the cover 135 down onto the base 121 the pawls 205 are cammed outwardly by the inclined outer surfaces of the feet 191 such that the pawls 205 are separated and dropped below the detentes 155 to lock the protective cover 122 onto the base 121 in a fashion to surround the cover 135. Molded at two diagonally opposite corners 203 of the protective cover 122 are spring members 206 which bias against the tops of the pillars 143 and 144 respectively and urge the protective cover 122 away from the base 121 assuring that the pawls 205 remain in engagement with the undersurface of the detentes 155 protecting the force applying mechanism and the die from harm caused by side or vertical impact to the temporary package.

The pawls 205 on the ends of the corner members 203 are also provided with beveled edges beneath the shoulder forming the hook such that automated assembly equipment may engage the temporary package from the lower surface as shown in FIG. 12 and engage these beveled surfaces on the pawls 205 and pawls or feet 191 to urge the same out of engagement with the detentes 154 and 155 respectively. Disengagement of the pawls and feet from these detentes separates the protective cover 122 and the cover 135 from the base 121 permitting the die 125 to be relocated and removed from the temporary package 120. Further, with the automated equipment the die 125 can be optically aligned on the insert 124 as above mentioned and the lid 130 and protective cover 122 are assembled automatically onto the base with the feet on the pawls 191 and 205 being forced outwardly by the detentes 154 and 155 on the base until the same engage with the hook members thereof. The pawls 191 and 205 can be simultaneously released from the base by cam means applying a force from the side of the base opposite the support surface and against the beveled bottom edges of the pawls 191 and 205.

Having thus described the present invention with respect to several embodiments, it should be understood that modifications can be made in the various portions of the temporary packages without departing from the spirit of the invention as defined in the appended claims.

We claim:

1. A temporary package for use with a bare die comprising:

a base of generally rectangular configuration with a top and bottom surface and four sides, said base having recesses in at least two of said sides and means for locating said die on said top surface, a plurality of contact strips having an elongate shape adapted to fit in said recesses, means for temporarily securing said strips in said recesses, each contact strip comprising a plurality of contacts formed at one end to make electrical contact with said die and having the second end positioned transversely opposite said one end with relationship to said contact strip to afford electrical contact along a side of said base, and a force applying mechanism supported from said base for biasing said die toward base to afford electrical connection between said die, said contacts and the periphery of said base, said force applying mechanism comprising a pressure plate to contact said die, bias means for forcing said pressure plate toward said base, and a cover attached to said base and supporting said bias means for restricting movement of said cover from said base such that said bias means urges said pressure plate and said die into electrical engagement with the contacts on the contact strip, and a protective cover mounted on said base and movable in relationship to said base to protect said force applying mechanism from side and vertical pressure received by said package.

2. A temporary package according to claim 1 wherein said force applying mechanism has a centrally positioned opening extending therethrough for receiving said die carrying probe for loading said die onto said base for making electrical contact with said contact strip and for positioning said pressure plate in place.

3. A temporary package for a bare die adapted to place said die in a test and burn-in socket, said package comprising:

a base member having a rectangular configuration to fit in a socket, said base member having means defining a surface to support said bare die and having a plurality of sides defining a peripheral surface, at least two oppositely facing sides having detents for receiving a pawl, and a lid comprising a pressure plate movably supported in a cover and bias means for urging said pressure plate from said cover, said cover having means restricting movement of said pressure plate in a direction from said cover and pawl means on said cover for engaging said detents of said base member to releasably secure said lid to said base member and to place said bias means in compression, said pawl means being releasable from said detents upon engagement from the side of said base member opposite said support surface for a said die, whereby said lid can be mechanically released from said base member, and a protective cover positioned to surround said lid, said protective cover having pawl means positioned adjacent to the pawls means on said cover to secure said protective cover releasably over said lid, said pawl means on said protective cover being positioned for release upon release of said pawl means on said cover.

4. A temporary package according to claim 3 wherein said lid has a centrally positioned opening extending therethrough for receiving a die carrying probe for loading a die onto said base member and for positioning said lid and said pressure plate in place.

5. A temporary package according to claim 3 wherein said base is formed with a plurality of recesses in its periphery and said package further comprises a plurality of contact strips having an elongate shape adapted to fit in said recesses, means for temporarily securing said strips in said recesses, each contact strip comprising a plurality of contacts formed at one end to make electrical connection with said die and having the second end positioned transversely opposite said one end, with relationship to said contact strip, to afford electrical contact along a side of said base member.

6. A temporary package according to claim 5 wherein said package further comprises an insert formed to make direct electrical contact with a said die and electrical contact with said one end of each of said contacts on said contact strips.

7. A temporary package for a bare die adapted to place said die in a test and burn-in socket, said package comprising:

a base member having a rectangular configuration to fit in a socket, said base member having means defining a surface to locate an insert adapted for direct contact with one surface of said bare die, and said base member having a plurality of sides defining a peripheral surface, each of said sides having a recess, and said sides being joined at truncated corners, at least two of which have detent means for supporting a lid, said lid comprising a pressure plate movably supported in a cover and bias means for urging said pressure plate from said cover, said cover having means restricting movement of said pressure plate in a direction from said cover and pawl means on said cover for engaging said detent means of said base member to releasably secure said lid to said base member and to place said bias means in compression, said pawl means being releasable from said detent means upon engagement from the side of said base opposite said support surface for said insert, whereby said lid can be mechanically released from said base member, and a plurality of contact strips having an elongate shape adapted to fit, one in each of said recesses in the base member, means for temporarily securing said strips in said recesses, each contact strip comprising a plurality of contacts formed at one end to make electrical connection with said insert and having the second end positioned transversely opposite said one end, with relationship to said contact strip, to afford electrical contact along a side of said base member, and a protective cover positioned to surround said lid, said protective cover having pawl means positioned to secure said protective cover releasably over said lid, said pawl means on said protective cover being positioned for release upon release of said pawl means on said cover.

* * * * *

UNITED STATES PATENT AND TRADEMARK OFFICE
Certificate

Patent No. 5,451,165            Patented: September 19, 1995

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Carol L. Clearley-Cabbiness, David S. Hardcastle, Alan G. Wood and Warren M. Farnworth.

Signed and Sealed this Sixth Day of April, 1999.

BRIAN W. BROWN
*Special Programs Examiner*
Technology Center 2800